US008754825B2

(12) United States Patent
Bengtsson

(10) Patent No.: US 8,754,825 B2
(45) Date of Patent: Jun. 17, 2014

(54) CONTROL LOGIC FOR ADAPTIVE ANTENNA

(75) Inventor: Erik L. Bengtsson, Eslov (SE)

(73) Assignee: Nokia Corporation, Espoo (FI)

( * ) Notice: Subject to any disclaimer, the term of this patent is extended or adjusted under 35 U.S.C. 154(b) by 762 days.

(21) Appl. No.: 12/761,572

(22) Filed: Apr. 16, 2010

(65) Prior Publication Data

US 2011/0254751 A1  Oct. 20, 2011

(51) Int. Cl.
*H01Q 1/50* (2006.01)
*H01Q 9/00* (2006.01)
*H01Q 9/30* (2006.01)

(52) U.S. Cl.
USPC ............ 343/860; 343/861; 343/745; 343/750

(58) Field of Classification Search
CPC .......... H01Q 1/243; H01Q 9/145; H01Q 9/30
USPC ................... 343/860, 861, 745, 750
See application file for complete search history.

(56) References Cited

U.S. PATENT DOCUMENTS

| | | | |
|---|---|---|---|
| 5,564,086 A * | 10/1996 | Cygan et al. | 455/126 |
| 7,199,678 B2 | 4/2007 | Matsuno | 333/17.3 |
| 7,260,424 B2 | 8/2007 | Schmidt | 455/575.7 |
| 2005/0093624 A1 | 5/2005 | Forrester et al. | 330/129 |
| 2006/0183442 A1 | 8/2006 | Chang et al. | 455/121 |
| 2007/0197180 A1 | 8/2007 | McKinzie, III et al. | 455/248.1 |
| 2009/0051610 A1 | 2/2009 | Sugiyama | 343/745 |
| 2009/0073076 A1* | 3/2009 | Skarp et al. | 343/860 |
| 2010/0016041 A1 | 1/2010 | Ying et al. | 455/575.4 |

FOREIGN PATENT DOCUMENTS

| | | |
|---|---|---|
| EP | 1 528 626 A2 | 5/2005 |
| GB | 1170890 A | 11/1969 |
| WO | WO-2006/089019 A1 | 8/2006 |
| WO | WO-2009/064968 A1 | 5/2009 |

OTHER PUBLICATIONS

"Experimental Results of the Adaptive Impedance Matching System", Ichirou Ida and Jun-ichi Takada, Tokyo Institute of Technology, Dept. of International Development Engineering, Tokyo, Japan, Sep. 2004, 3 pgs.

* cited by examiner

*Primary Examiner* — Jacob Y Choi
*Assistant Examiner* — Graham Smith
(74) *Attorney, Agent, or Firm* — Harrington & Smith

(57) ABSTRACT

A method includes, during transmission and/or reception of a radio frequency signal, detecting an impedance associated with an antenna connected with a matching network; algorithmically determining a reactance value of at least one reactive element that forms a part of the matching network in accordance with the detected impedance and at least one parameter including at least one of a currently used radio frequency, at least one user/device factor, at least one radio frequency offset value, and at least one predetermined constant; and setting the value of the at least one reactive element to match the determined value.

22 Claims, 6 Drawing Sheets

FIG.5 HB TABLE

CONTROL LOGIC FOR ADAPTIVE ANTENNA

TECHNICAL FIELD

The exemplary and non-limiting embodiments of this invention relate generally to wireless communication systems, methods, devices and computer programs and, more specifically, relate to tunable radio frequency antennas.

BACKGROUND

This section is intended to provide a background or context to the invention that is recited in the claims. The description herein may include concepts that could be pursued, but are not necessarily ones that have been previously conceived, implemented or described. Therefore, unless otherwise indicated herein, what is described in this section is not prior art to the description and claims in this application and is not admitted to be prior art by inclusion in this section.

The following abbreviations that may be found in the specification and/or the drawing figures are defined as follows:

BST (Ba,Sr)TiO$_3$
FET field effect transistor
LB lower (frequency) band
LUT lookup table
MEMS micro-electromechanical system
MIMO multiple input-multiple output
R&D research and development
RF radio frequency
RL return loss (dB, impedance)
RX receive
TX transmit
UB upper (frequency) band
UI user interface
WCDMA wideband code division multiple access The use of a tunable antenna typically requires some type of logic to control the needed antenna tuning states. For a simple switched antenna with just a few states (e.g., 2-6) a LUT can be used. However, for more advanced and more complex tunable antennas the number of possible states can be so large that the LUT approach can become impractical. This is due at least to the required size of the LUT in order to incorporate tuning data for all of the possible states.

SUMMARY

The foregoing and other problems are overcome, and other advantages are realized, by the use of the exemplary embodiments of this invention.

In a first aspect thereof the exemplary embodiments of this invention provide a method that comprises, during transmission and/or reception of a radio frequency signal, detecting an impedance associated with an antenna connected with a matching network; algorithmically determining a reactance value of at least one reactive element that comprises the matching network in accordance with the detected impedance and at least one parameter comprising at least one of a currently used radio frequency, at least one user/device factor, at least one radio frequency offset value, and at least one predetermined constant; and setting the value of the at least one reactive element to match the determined value.

In a further aspect thereof the exemplary embodiments of the invention provide an apparatus that comprises a processor and a memory including computer program code. The memory and computer program code are configured to, with the processor, cause the apparatus at least to perform, during transmission and/or reception of a radio frequency signal, detecting an impedance associated with an antenna connected with a matching network; algorithmically determining a reactance value of at least one reactive element that comprises the matching network in accordance with the detected impedance and at least one parameter comprising at least one of a currently used radio frequency, at least one user/device factor, at least one radio frequency offset value, and at least one predetermined constant; and setting the value of the at least one reactive element to match the determined value.

DETAILED DESCRIPTION

Figure 1:
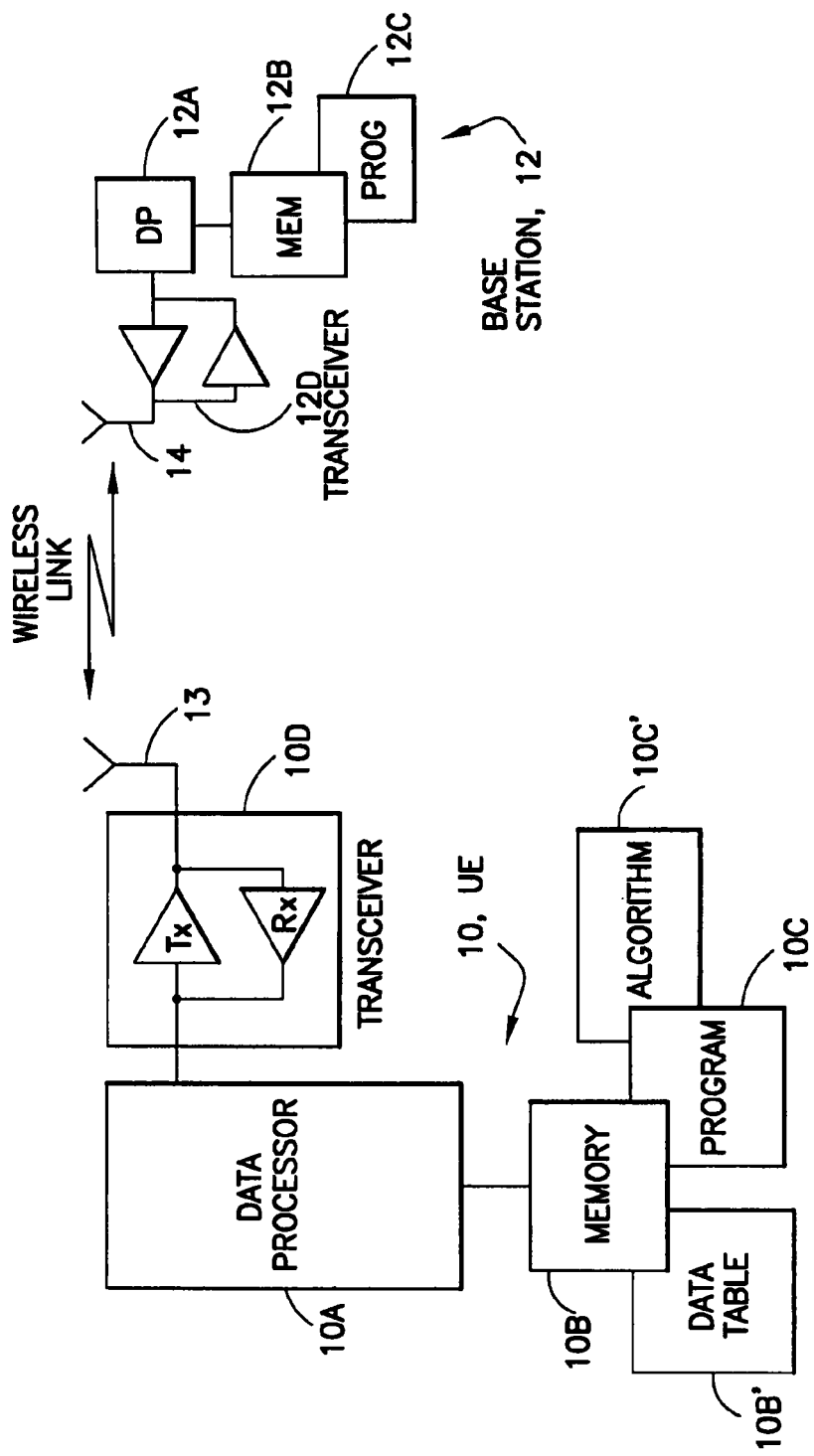
FIG. 1 illustrates a simplified block diagram of various electronic devices and apparatus that are suitable for use in practicing the exemplary embodiments of this invention.

Before describing in further detail the exemplary embodiments of this invention, reference is made to FIG. 1 for illustrating a simplified block diagram of various electronic devices and apparatus that are suitable for use in practicing the exemplary embodiments of this invention. In FIG. 1 a wireless network is adapted for communication over a wireless link with an apparatus, such as a mobile communication device which may be referred to as a user equipment (UE) 10 via a network access node such as a Node B (base station) 12. The UE 10 includes at least one controller, such as a computer, microcontroller and/or a data processor 10A, a non-transitory computer-readable memory medium embodied as at least one memory 10B that stores a program of computer instructions 10C, and a suitable radio frequency (RF) transceiver 10D for bidirectional wireless communications with the base station 12 via one or more antennas 13. The base station 12 also includes a controller, such as a computer or a data processor 12A, a computer-readable memory medium embodied as a memory 12B that stores a program of computer instructions 12C, and a suitable RF transceiver 12D for communication with the UE 10 via one or more antennas 14 (typically several when MIMO operation is in use).

The program 10C is assumed to include program instructions that, when executed by the associated DP 10A, enable the UE 10 to operate in accordance with the exemplary embodiments of this invention, as will be discussed below in greater detail. To this end the program 10C includes program code implementing an algorithm 10C' for determining, in conjunction with the data table 10B', values of various tunable capacitors that form a part of a tuner (matching network) 20 connected with the antenna 13 (see FIGS. 2 and 3). The algorithm 10C' can also be responsive to other input parameters, as described in detail below. The exemplary embodiments of this invention may be implemented at least in part by computer software executable by the data processor 10A of the UE 10, or by hardware, or by a combination of software and hardware (and firmware).

In general, the various embodiments of the UE 10 can include, but are not limited to, cellular telephones, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions.

The computer-readable memories 10B and 12B may be of any type suitable to the local technical environment and may be implemented using any suitable data storage technology, such as semiconductor based memory devices, flash memory, magnetic memory devices and systems, optical memory devices and systems, fixed memory and removable memory. The data processors 10A and 12A may be of any type suitable to the local technical environment, and may include one or more of general purpose computers, special purpose computers, microprocessors, digital signal processors (DSPs) and processors based on multi-core processor architectures, as non-limiting examples.

Figure 2:
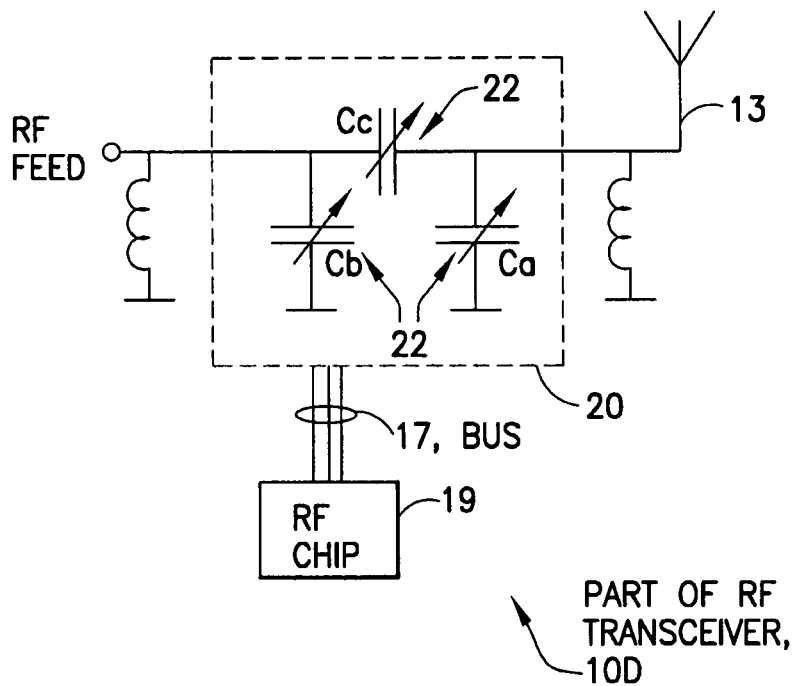
FIG. 2 shows a tuner that forms a part of the RF transceiver of FIG. 1 in further detail.

FIG. 2 shows a portion of the UE RF transceiver 10D in further detail. In an exemplary embodiment the antenna 13 is connected with a tuner 20 that uses a PI network circuit topology of tunable capacitors in a capacitor array 22 to tune the input impedance of the antenna 13. The individual capacitors of the array 22 are designated for convenience as Ca, Cb and Cc.

The tunable capacitor array 22 can have in the range of, for example, 4-7 binary weighted capacitors that may be selectively interconnected via switches of some type. Each capacitor may have, for example, between 5 and 8 states, depending on technology (e.g., FET, MEMS, or BST). This yields more than 100 possible discrete states that the capacitor array 22 can attain. Further, in a practical implementation of a matching network there can be two, three or more of the tunable capacitor arrays 22. For an exemplary use case of three capacitor arrays 22 the total resulting number of discrete states can number in the thousands. While not all of these states are normally technically useful, the fine resolution thus provided enables optimum tuning for each frequency channel and for each use case. The use cases can include, for example, whether the UE 10 is being handheld, whether the UE 10 is being held near to or far away from the user's ear, and the package or device body state of the UE 10 (e.g., slider open/closed, cover open/closed, etc.) Some of these various use cases, as well as others not specifically mentioned, may also be referred to herein, without a loss of generality, as environmental factors (e.g., slide open/closed) and/or as user interface mode factors or data. Alternatively, these various use cases may be collectively referred to as user/device factors. It is assumed that the state of the slider generates a signal that is detectable by the data processor 10A of FIG. 1 and that can be made available to the algorithm 10C'.

One non-limiting example of a "slider" is shown in commonly owned US Patent Publication 2010/0016041 A1, "Electronic Device with Movable Housing Parts", Liu Ying et al. This application describes a device with a base housing part and two slidably suspended cover parts that can move in opposite directions between a retracted position in which they substantially abut one another and conceal an operating face and an extended position in which they do not conceal the operating face. At least one of the covers can also assume an intermediate position between the retracted position and the extended position in which a portion of the operating face is not concealed.

Still referring to FIG. 2 there can be a bus 17, such as an RF bus that is sourced from or otherwise associated with an RF chip or module 19. The RF bus 17 can be driven by a microcontroller of the RF chip 19 (e.g., see FIG. 3), and can be used in one non-limiting example to apply digital programming signals to the capacitor arrays 22 for setting the states (open/closed) of the various switches interconnecting the (e.g., 4-7 binary weighted capacitors) that form each of the capacitors Ca, Cb and Cc.

Note that the bus 17 can be used for other purposes as well. As one non-limiting example the bus 17 can also be used to read a calibration setting that has been measured and programmed by a supplier.

As can be appreciated, multiplying all possible RF channels by all use cases yields a large number of states. If a LUT were used to define all of these states for all three capacitor arrays a large physical memory would be needed to store all of the possible capacitor array programming combinations. Further, a significant amount of effort and time would be needed to define all of the possible states so that they could be stored in the LUT.

The exemplary embodiments avoid these problems by implementing a formula that calculates the individual capacitor settings based on different input parameters, thereby simplifying the implementation of the tuner 20 in the R&D phase, in other words during design development of the UE 10, as well as simplifying the task of programming the capacitor array(s) 22 during use. The input parameters can include, as non-limiting examples, the frequency, the environmental factors (e.g., slide open/closed), and the antenna loading.

During the R&D phase of the UE development an optimal state for some subset of the possible frequencies may be programmed (iteratively), and a function of how the capacitor value depends on the frequency is determined for each capacitor (e.g., for each of Ca, Cb and Cc). In a similar manner a determination may be made of how the capacitor value should be changed to compensate for changes in the input parameters (e.g., for a change in antenna loading). In general, for each UE 10 use program the formula may be the same, but the sensitivity to the parameters can be customized.

In a closed loop implementation there is continuous feedback of the return-loss associated with the antenna. Initially the frequency is programmed and then, dependent on the antenna loading and the value of the return-loss, the tuner 20 may require calibration. In the closed loop implementation an iterative process occurs to substantially continuously monitor the impedance, as well as other factors, so as to enable the substantially continuous adjustment, if needed, of the capacitor values of the tuner matching network 20.

Figure 3:
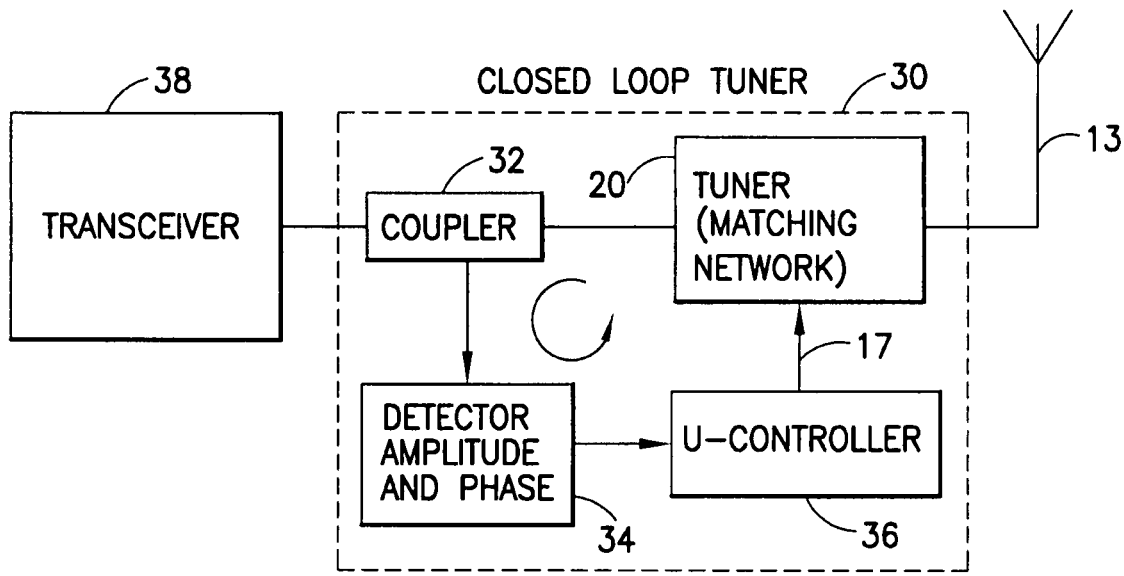
FIG. 3 shows an exemplary embodiment of a closed loop tuner that includes the tuner of FIG. 2 connected with the antenna.

FIG. 3 shows an exemplary embodiment of a closed loop tuner 30 that includes the tuner 20 of FIG. 2 connected with the antenna 13. The closed loop tuner 30 is shown for convenience as being connected with a transceiver (transmitter/ receiver) unit or module 38 (see the transceiver 10D of FIG. 1) from which RF signals to be transmitted are input and into which received RF signals are provided. A radio frequency coupler 32, such as a directional coupler, senses forward (towards the tuner 20) and reflected (from the tuner 20) RF power. A RF detector 34 detects the amplitude and phase of the RF signals output from the coupler 32. The detected amplitude and phase can be considered as being indicative of antenna loading. An algorithm, such as the algorithm 10C', executing in a microcontroller 36 determines the needed values of the tuner 20 capacitors Ca, Cb and Cc for the one or more capacitor arrays 22 contained in the tuner 20 based on the impedance sensed by the detector 34 and other factors, including information stored in the data table 10B' of FIG. 1.

It should be noted that the exemplary embodiments can be advantageously applied during RF transmission, during RF reception, and also in a full duplex case during simultaneous RF transmission and reception. It should also be noted that the tuner can be implemented in series with the RF path, or in a way so that it is able to affect the antenna impedance. For example, the tuner may not lie in series with the RF transmission and reception path to the antenna 13 but may be disposed between the antenna radiator and the ground plane so as to provide antenna impedance adjustment in an indirect manner. In other words, the specific arrangement and placement of the capacitors, such as those shown in FIG. 2, are exemplary, and other arrangements and/or placements of the capacitors (and inductors) relative to the antenna radiator can be accommodated by the exemplary embodiments.

The properties of the closed loop tuner 30 include, but are not limited to, an ability to self-calibrate the antenna 13, an ability to automatically correct for potential temperature drift or aging, an ability to re-tune the antenna 13 to compensate for different states (e.g., slider open/closed), to compensate for isolation degradation between more than one antenna within the UE 10, and an ability to automatically compensate for any detuning of the antenna 13 caused by user interaction.

Figure 4:
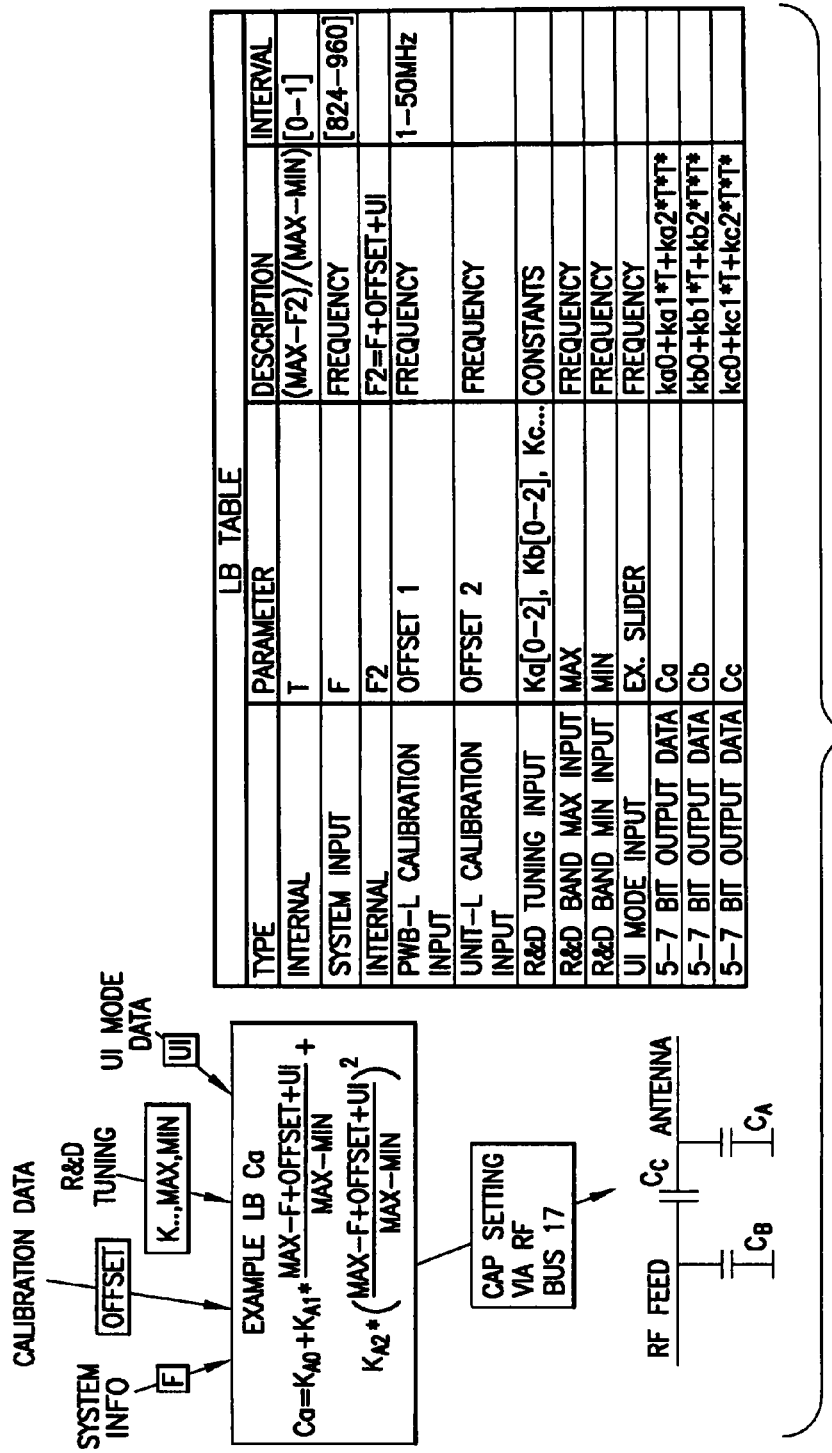
FIG. 4 presents a non-limiting example of a generic specification implemented for three tunable components (Ca, Cb and Cc) of the tuner of FIGS. 2 and 3 in a lower frequency band.

FIG. 4 presents a non-limiting example of how a generic specification can be implemented. The specification is implemented for three tunable components (Ca, Cb and Cc) in the lower frequency band (LB, or 824 MHz to 960 MHz in this example). The formula in FIG. 4, also shown below, is a polynomial of $2^{nd}$ order. The coefficients have a default (start up) value, that may be obtained from the data table 10B', and are then affected differently depending on the stimuli from different sources (e.g., system information, calibration data, R&D tuning data and user/device factors data (e.g., slider state). The output of the formula represents output data for setting the capacitance value of a particular capacitor (e.g., Ca). The output data can be provided over the bus 17 in any desired format (e.g., 5-7 parallel bits or in a bit serial fashion). Typical capacitance values are in a range of some number of picofarads (pF).

$$Ca = K_{A0} + K_{A1} * \frac{max - F + \text{offset} + UI}{max - min} + K_{A2} * \left(\frac{max - F + \text{offset} + UI}{max - min}\right)^2$$

In the context of FIG. 4 PWB-L refers to a testing/calibration procedure performed during production on a printed wiring board level, before assembly of the printed wiring board onto the UE 10. Unit-L refers to a final testing/calibration procedure performed during production after the UE 10 is assembled as a unit (unit level). Note that the PWB-L and Unit-L calibration inputs may not affect the tuning the same way (offset) depending on the underlying topology. Note also that capacitor tolerances may affect the RL differently than antenna tolerances.

It should be noted that a testing/calibration procedure can be construed as including a case where a supplier of a particular reactive component measures the component, and the measured value(s) are saved as a calibration setting.

As is well known the return loss (RL) is the difference, in dB, between forward and reflected power measured at any given point in an RF system. The PWB-L and Unit-L values can be stored in the memory 10B (in a non-volatile portion thereof) during or after production calibration for use by the algorithm 10C'. Likewise, the memory 10B can contain the various values related to R&D tuning constants and any other similar information needed by the algorithm 10C'. These various offsets and constants are shown stored in FIG. 1 as the data table 10B' associated with the memory 10B.

FIG. 4 shows an exemplary embodiment of the formula for setting Ca. An additional formula is used for setting Cb, and another formula is used for setting Cc. These additional formulas would be similar in some respects to the formula for Ca.

Figure 5:
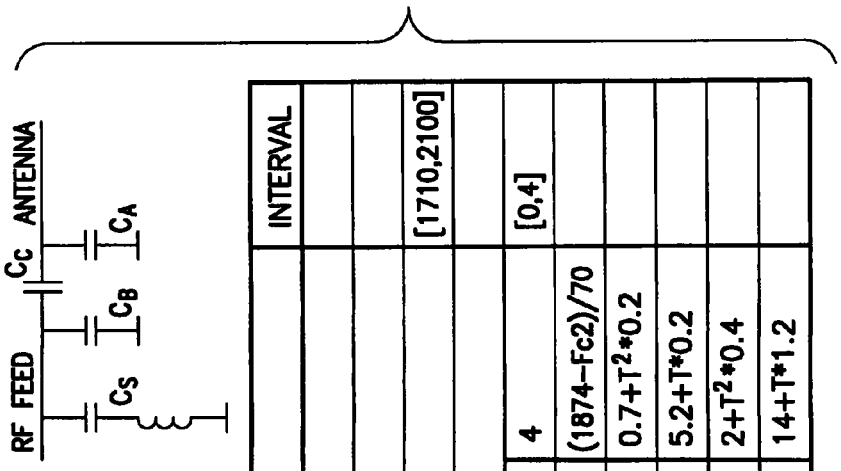
FIG. 5 shows an exemplary higher band table for use in a frequency range of 1710 MHz to 2100 MHz.

FIG. 5 shows an exemplary HB table for a frequency range of 1710 MHz to 2100 MHz. FIG. 5 also shows the setting of an additional capacitor Cs having a first node connected to ground via an inductance and a second node connected to the RF feed. Note that for the HB case a mode (M) parameter is included to adjust for a change in duplex distance between the different bands. In this non-limiting example Mode 0=GSM, Mode 1=WCDMA band I, Mode 2=WCDMA band II, Mode 3=WCDMA band II, and Mode 4=WCDMA band IV. Note that certain constants can be accessed if desired from a table.

It can be noted that a constant can be representative of the detector output. If the amplitude and phase are continuously measured in the closed loop system the values can be stored in a lookup table and continuously renewed/refreshed with respect to time. Then, if needed in the calculation, they are accessed from the LUT and placed in the formula as a constant. This constant can be a complex number (A+jB) having both amplitude and phase information. The microcontroller 36 (see FIG. 3) uses the amplitude and phase information to calculate the capacitor values.

In general, the sensed antenna loading can be converted to a figure of merit (FOM) that can be used to tune the capacitors. This can be accomplished by use of an additional frequency offset parameter. However, if the RL is moving differently (than just from frequency tuning) then a more complex formula may be needed.

The RL may be a complex number that may need to be converted to fit into the formula. One may wish to extract "frequency tuning" and/or "impedance change" as two separate parameters and feed them into the formula with different coefficients. In this case the extracted parameters can be considered as the FOM. If the impedance always behaves in the same way when loaded a single parameter could be used (1 dimensional), and this would then be the FOM.

Figure 6:
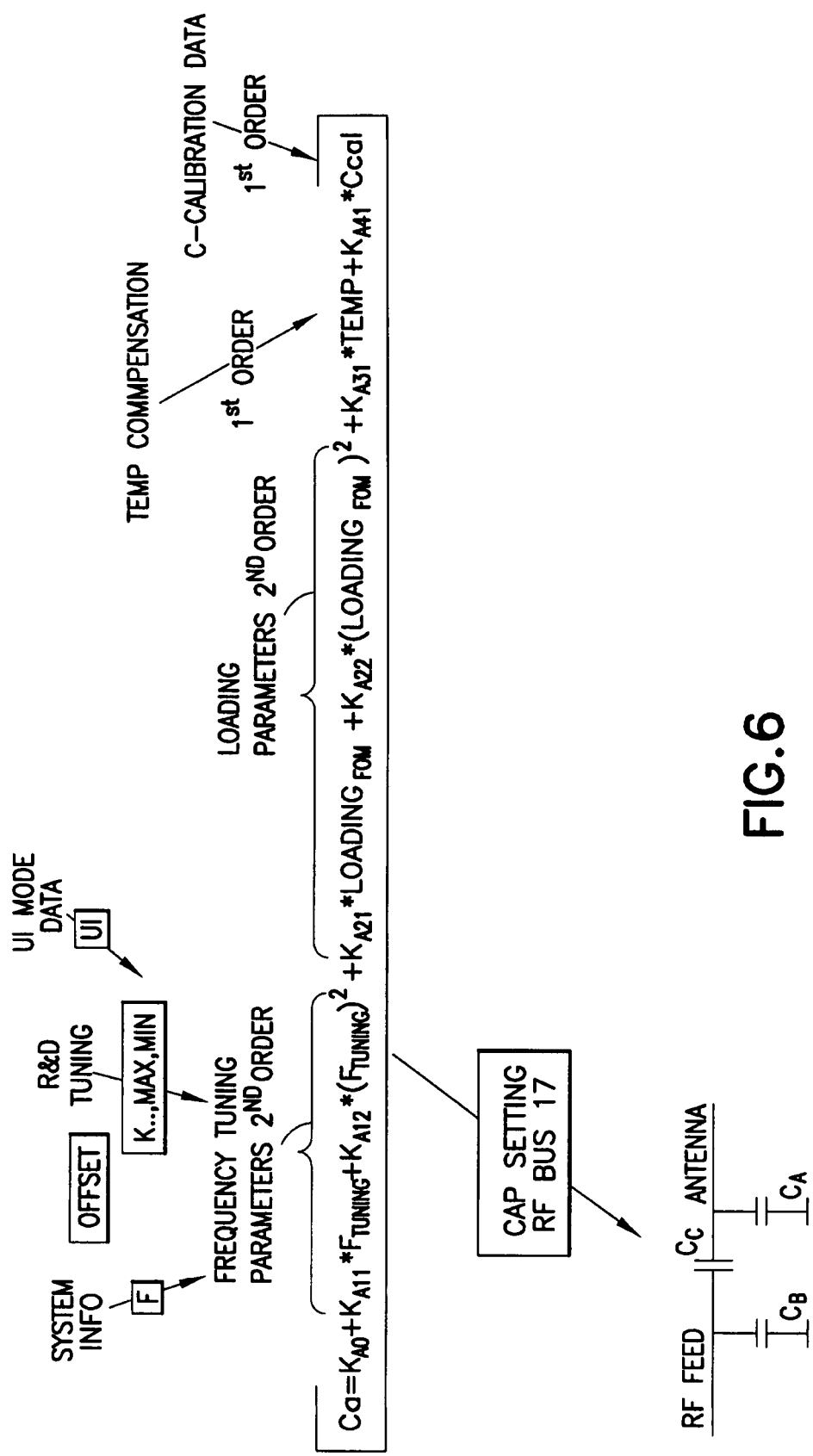
FIG. 6 presents another non-limiting example of a generic specification implemented for the three tunable components (Ca, Cb and Cc) of the tuner of FIGS. 2 and 3.

Reference in this regard can be made to FIG. 6, which represents a non-limiting example of a formula for parameters for not only tuning the frequency but also changing the RL. In this example there are second order frequency tuning parameters, second order loading parameters, a first order temperature compensation parameter and a first order capacitor calibration parameter.

The resulting formula (in this non-limiting example), can be expressed as:

$$Ca = K_{A10} + K_{A11} * F_{Tuning} + K_{A12} * (F_{Tuning})^2 + \\ K_{A21} * \text{loading}_{FCM} + K_{A22} * (\text{loading}_{FCM})^2 + \\ K_{A31} * \text{temp} + K_{A41} * \text{Ccal}.$$

KA10 can be seen as an offset that includes possible contributions from all parameters.

Note that in some embodiments third order parameters may be used as well.

Different effects can result in changing the needed compensation accordingly. For example, temperature will affect all capacitors in the same manner, and a first order scaling of all tuning elements (direct or indirect feedback) can be used. Further by example, tuning (e.g., manually) a second order polynomial can be used to calculate the needed values. Also, antenna electric length calibration, in the illustrated examples, may best be performed by compensating using only Cc. All of these parameters and constants can be incorporated into a single formula as shown that is used for algorithmically setting the values of the capacitors of the tuning network 20.

Figure 7:
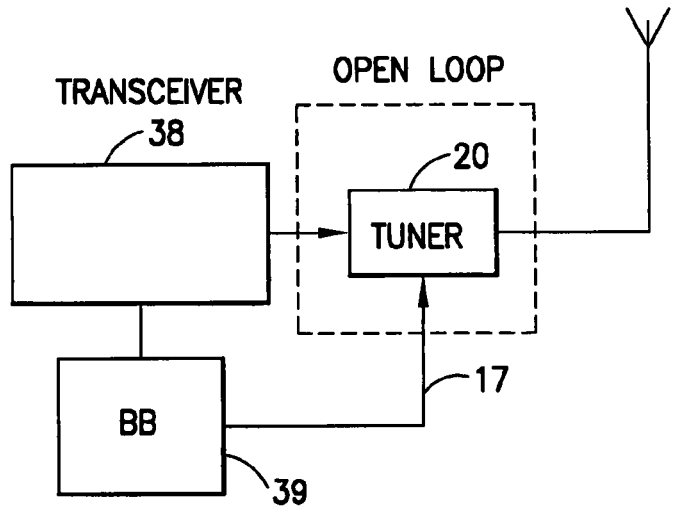
FIG. 7 shows an exemplary embodiment of an open loop tuner that includes the tuner of FIG. 2 connected with the antenna.

While described thus far in the context of a closed loop antenna tuning system, the exemplary embodiments also encompass open loop antenna tuning systems, such as one based on FIG. 7. In FIG. 7 the tuning bus 17 can be sourced from a baseband (BB) unit 39.

The exemplary embodiments also pertain to indirect feedback loops and to combinations of various types of feedback loops.

The indirect feedback approach is useful in a case where the RL of a finger in the antenna 13 is known. In this case the finger location can be measured and action taken accordingly (assuming that the RL will change).

It should be appreciated that the exemplary embodiments of this invention apply to both radio frequency transmission and radio frequency reception of the transceiver 38 as shown in FIG. 3.

As should be appreciated, the exemplary embodiments of this invention provide a number of advantages and technical effects. Several non-limiting examples of same include the following.

One technical effect that is obtained from the use of the exemplary embodiments is that different phone programs do not need to determine a number of tables for different conditions, instead a program-related scaling factor(s) can be determined and used algorithmically with other inputs to compute optimum capacitance values for the tuner 20. In addition, production calibration to compensate for tolerances can be readily enabled.

Another technical effect that is obtained from the use of the exemplary embodiments is that continuous tuning (channel tuning) is enabled with a realistic work load, and fine tuning in different use cases or implementations. Retuning of the antenna 13 is enabled to compensate for different states (e.g., slider open/closed), as well as to compensate for detuning caused by user interaction.

Another technical effect that is obtained from the use of the exemplary embodiments is that self-calibration of the antenna 13 is made possible.

Another technical effect that is obtained from the use of the exemplary embodiments is that automatic correction for potential temperature drift or aging is made possible.

Another technical effect that is obtained from the use of the exemplary embodiments is that an improvement in the perceived performance is obtained due at least to a reduction in mismatch loss and insertion loss (e.g., in a range of about 1 dB to about 4 dB). Furthermore, a reduction is needed output power can be achieved, leasing to increased talk time.

A still further technical effect that is obtained from the use of the exemplary embodiments is that a single algorithm is used containing all relevant input parameters that can affect the center frequency, impedance bandwidth or impedance level of the antenna.

A still further technical effect that is obtained from the use of the exemplary embodiments is that real time tuning of the antenna impedance, based on a plurality of input parameters related to variables which affect the RF performance of an antenna, such that the antenna RF performance is continuously maintained at an optimum level.

Based on the foregoing it should be apparent that the exemplary embodiments of this invention provide a method, apparatus and computer program(s) to algorithmically control the state of a multi-capacitor (more generally a multi-reactance) tuner for an adaptive antenna in accordance with a plurality of input parameters.

Figure 8:
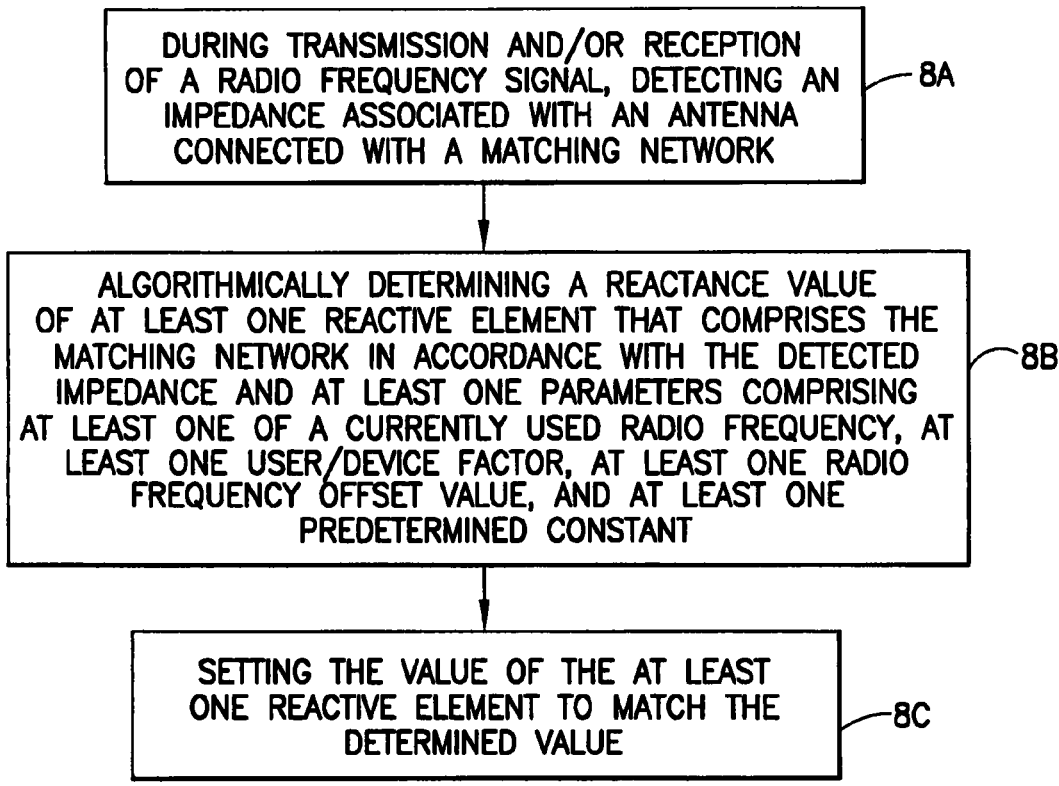
FIG. 8 is a logic flow diagram that illustrates the operation of a method, and a result of execution of computer program instructions embodied on a computer readable memory, in accordance with the exemplary embodiments of this invention.

FIG. 8 is a logic flow diagram that illustrates the operation of a method, and a result of execution of computer program instructions, in accordance with the exemplary embodiments of this invention. In accordance with these exemplary embodiments a method performs, at Block 8A, during transmission and/or reception of a radio frequency signal, detecting an impedance associated with an antenna connected with a matching network. At Block 8B the method performs algorithmically determining a reactance value of at least one reactive element that comprises the matching network in accordance with the detected impedance and at least one parameter comprising at least one of a currently used radio frequency, at least one user/device factor, at least one radio frequency offset value, and at least one predetermined constant. At Block 8C the method performs setting the value of the at least one reactive element to match the determined value.

The various blocks shown in FIG. 8 may be viewed as method steps, and/or as operations that result from operation of computer program code, and/or as a plurality of coupled logic circuit elements constructed to carry out the associated function(s).

The exemplary embodiments also pertain to an apparatus that comprises means, operable during transmission and/or reception of a radio frequency signal, for detecting an impedance associated with an antenna connected with a matching network; means for algorithmically determining a reactance value of at least one reactive element that comprises the matching network in accordance with the detected impedance and at least one parameter comprising at least one of a currently used radio frequency, at least one user/device factor, at least one radio frequency offset value, and at least one predetermined constant; and means for setting the value of the at least one reactive element to match the determined value.

The exemplary embodiments also pertain to a computer-readable memory medium that stores a software program, where execution of the software program by at least one data processor results in performing operations that comprise, during transmission and/or reception of a radio frequency signal, detecting an impedance associated with an antenna connected with a matching network; algorithmically determining a reactance value of at least one reactive element that comprises the matching network in accordance with the detected impedance and at least one parameter comprising at least one of a currently used radio frequency, at least one user/device factor, at least one radio frequency offset value, and at least one predetermined constant; and setting the value of the at least one reactive element to match the determined value.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the exemplary embodiments of this invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

It should thus be appreciated that at least some aspects of the exemplary embodiments of the inventions may be practiced in various components such as integrated circuit chips and modules, and that the exemplary embodiments of this invention may be realized in an apparatus that is embodied as an integrated circuit. The integrated circuit, or circuits, may comprise circuitry (as well as possibly firmware) for embodying at least one or more of a data processor or data processors, a digital signal processor or processors, baseband circuitry and radio frequency circuitry that are configurable so as to operate in accordance with the exemplary embodiments of this invention.

Various modifications and adaptations to the foregoing exemplary embodiments of this invention may become apparent to those skilled in the relevant arts in view of the foregoing description, when read in conjunction with the accompanying drawings. However, any and all modifications will still fall within the scope of the non-limiting and exemplary embodiments of this invention.

For example, while the exemplary embodiments have been described above in the context of the various systems, e.g., GSM, WCDMA, it should be appreciated that the exemplary embodiments of this invention are not limited for use with only these particular types of wireless communication system, and that they may be used to advantage in other wireless communication systems including, but not limited to, E-UTRAN (evolved universal terrestrial radio access network), also known as long term evolution (LTE), as well as enhancements thereto including LTE-A (LTE-advanced).

The phrase "algorithmically determining" has been used in the foregoing description and in the following claims at least in part to distinguish the exemplary embodiments from the mere use of a lookup table or similar type of procedure/structure to determine one or more antenna-related reactance values based on one or more input parameters. However, this phrase should not be construed in a limiting sense upon the implementation and practice of the exemplary embodiments, as the phrase "algebraically determining" or the phrase "arithmetically determining" could be used as well, as two non-limiting examples.

It should be noted that the terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof. As employed herein two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Further, the various names used for the described parameters (e.g., PWB-L, Unit-L, etc.) are not intended to be limiting in any respect, as these parameters may be identified by any suitable names. Further, the formulas and expressions that use these various and other parameters may differ from those expressly disclosed herein.

Further, and while the exemplary embodiments have been described in the context of adjustable capacitors, the exemplary embodiments can be employed to determines a value of other reactive components or elements (e.g., inductors) of the tuner matching network 20, if such components have a value capable of being programmably varied. As such, it should be appreciated that an aspect of the exemplary embodiments is the algorithmic determination of a capacitance value and/or an inductance value or, more generally, the algorithmic determination of a reactance value associated with at least one reactance element.

Furthermore, some of the features of the various non-limiting and exemplary embodiments of this invention may be used to advantage without the corresponding use of other features. As such, the foregoing description should be considered as merely illustrative of the principles, teachings and exemplary embodiments of this invention, and not in limitation thereof.

What is claimed is:

1. A method, comprising:
   during at least one of transmission and reception of a radio frequency signal, detecting an impedance associated with an antenna connected with a matching network;
   algorithmically determining a reactance value of at least one reactive element that comprises the matching network in accordance with a formula that contains the detected impedance as one input parameter and additional input parameters comprising in combination:
   a currently used radio frequency for the at least one of transmission and reception,
   at least one use case descriptive of at least one environmental factor of the apparatus that comprises the antenna,
   at least one radio frequency offset value, and
   at least one predetermined constant; and
   setting the value of the at least one reactive element to match the determined reactance value.

2. The method of claim 1, where detecting, algorithmically determining and setting are performed iteratively during the at least one of the transmission and reception of the radio frequency signal.

3. The method as in claim 1, where the at least one radio frequency offset value is determined during a production calibration of an apparatus or a portion of the apparatus in which the method is executed.

4. The method as in claim 1, where the at least one predetermined constant is determined during development of an apparatus in which the method is executed.

5. The method as in claim 1, where the matching network is comprised of a plurality of reactance elements connected between a radio frequency feed and the antenna, and where algorithmically determining determines the reactance value of one or more of the plurality of reactance elements.

6. The method as in claim 1, where algorithmically determining uses, for the at least one reactive element, a formula comprising at least one parameter of first order or higher order, and at least one constant.

7. The method as in claim 6, where the at least one first order parameter comprises a reactive element calibration parameter.

8. The method as in claim 6, where at least one second order parameter comprises at least one of a frequency tuning parameter and an antenna loading parameter.

9. The method as in claim 1, performed at least in part as a result of the execution of software instructions stored in a tangible, computer-readable memory medium.

10. The method as in claim 9, where the tangible, computer-readable memory medium comprises a part of a mobile phone.

11. An apparatus, comprising:
a processor; and
a memory including computer program code, where the memory and computer program code are configured to, with the processor, cause the apparatus at least to perform, during at least one of transmission and reception of a radio frequency signal,
detecting an impedance associated with an antenna connected with a matching network;
algorithmically determining a reactance value of at least one reactive element that comprises the matching network in accordance with a formula that contains the detected impedance as one input parameter and additional input parameters comprising in combination:
a currently used radio frequency for the at least one of transmission and reception,
at least one use case descriptive of at least one environmental factor of the apparatus,
at least one radio frequency offset value, and
at least one predetermined constant; and
setting the value of the at least one reactive element to match the determined value.

12. The apparatus of claim 11, where detecting, algorithmically determining and setting are performed iteratively during the at least one of the transmission and reception of the radio frequency signal.

13. The apparatus as in claim 11, where the at least one radio frequency offset value is determined during a production calibration of the apparatus or a portion of the apparatus.

14. The apparatus as in claim 11, where the at least one predetermined constant is determined during development of the apparatus.

15. The apparatus as in claim 11, where the matching network is comprised of a plurality of reactance elements connected between a radio frequency feed and the antenna, and where algorithmically determining determines the reactance value of one or more of the plurality of reactance elements.

16. The apparatus as in claim 11, where algorithmically determining uses, for the at least one reactive element, a formula comprising at least one parameter of first order or higher order, and at least one constant.

17. The apparatus as in claim 16, where the at least one first order parameter comprises a reactive element calibration parameter.

18. The apparatus as in claim 16, where at least one second order parameter comprises at least one of a frequency tuning parameter and an antenna loading parameter.

19. The apparatus as in claim 11, where the apparatus is comprised of a portable electronic device.

20. The apparatus as in claim 11, further comprising a bus connecting the data processor to the matching network, where the bus is used at least to convey digital information for setting the value of each of the plurality of capacitors to agree with the determined value.

21. The method as in claim 1, where the at least one use case of the apparatus comprises at least one of the following:
whether the apparatus is being held by a user;
the proximity of the apparatus to an ear of the user; and
a body state of the apparatus.

22. The apparatus as in claim 11, where the at least one use case of the apparatus comprises at least one of the following:
whether the apparatus is being held by a user;
the proximity of the apparatus to an ear of the user; and
a body state of the apparatus.

* * * * *